United States Patent
Huang

(10) Patent No.: US 8,099,644 B2
(45) Date of Patent: Jan. 17, 2012

(54) ENCODERS AND METHODS FOR ENCODING DIGITAL DATA WITH LOW-DENSITY PARITY CHECK MATRIX

(75) Inventor: Wei-Hung Huang, Hsinchu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 887 days.

(21) Appl. No.: 12/138,452

(22) Filed: Jun. 13, 2008

(65) Prior Publication Data

US 2009/0313523 A1 Dec. 17, 2009

(51) Int. Cl.
*H03M 13/00* (2006.01)
(52) U.S. Cl. ........................................ 714/752; 714/758
(58) Field of Classification Search ................ 714/752, 714/758

See application file for complete search history.

(56) References Cited

U.S. PATENT DOCUMENTS

| 7,178,080 B2 * | 2/2007 | Hocevar | 714/752 |
| 7,530,002 B2 * | 5/2009 | Lee et al. | 714/758 |
| 2010/0251065 A1 * | 9/2010 | Livshitz | 714/752 |
| 2011/0055655 A1 * | 3/2011 | Hocevar | 714/752 |

* cited by examiner

*Primary Examiner* — Sam Rizk

(74) *Attorney, Agent, or Firm* — Winston Hsu; Scott Margo

(57) ABSTRACT

A method for encoding digital data with a low-density parity check (LDPC) matrix includes: indirectly storing a non-regular portion of the LDPC matrix by storing a plurality of indices corresponding to a plurality of non-zero sub-matrices of the non-regular portion, and by storing a plurality of distance/location parameters respectively corresponding to numbers of zero sub-matrices between adjacent non-zero sub-matrices of the non-regular portion or respectively corresponding to distances between adjacent non-zero sub-matrices of the non-regular portion; generating at least one address according to at least one distance/location parameter; accessing information bits corresponding to the address; and recovering at least one element of the LDPC matrix according to at least one index and the information bits to encode the digital data according to the LDPC matrix.

24 Claims, 13 Drawing Sheets $$H = \begin{bmatrix} Pa_{1,1} & Pa_{1,2} & \cdots & Pa_{1,(c-1)} & Pa_{1,c} \\ Pa_{2,1} & Pa_{2,2} & \cdots & Pa_{2,(c-1)} & Pa_{2,c} \\ \cdots & \cdots & \cdots & \cdots & \cdots \\ Pa_{m,1} & Pa_{m,2} & \cdots & Pa_{m,(c-1)} & Pa_{m,c} \end{bmatrix}$$

FIG. 1 RELATED ART $$P_0 = \begin{bmatrix} 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \end{bmatrix}$$

FIG. 2 RELATED ART $$P_1 = \begin{bmatrix} 0 & 0 & 0 & 0 & 0 & 0 & 1 & 0 \\ 0 & 0 & 0 & 0 & 0 & 1 & 0 & 0 \\ 0 & 0 & 0 & 0 & 1 & 0 & 0 & 0 \\ 0 & 0 & 0 & 1 & 0 & 0 & 0 & 0 \\ 0 & 0 & 1 & 0 & 0 & 0 & 0 & 0 \\ 0 & 1 & 0 & 0 & 0 & 0 & 0 & 0 \\ 1 & 0 & 0 & 0 & 0 & 0 & 0 & 0 \\ 0 & 0 & 0 & 0 & 0 & 0 & 0 & 1 \end{bmatrix}$$

FIG. 3 RELATED ART $$P_5 = \begin{bmatrix} 0 & 0 & 1 & 0 & 0 & 0 & 0 & 0 \\ 0 & 1 & 0 & 0 & 0 & 0 & 0 & 0 \\ 1 & 0 & 0 & 0 & 0 & 0 & 0 & 0 \\ 0 & 0 & 0 & 0 & 0 & 0 & 0 & 1 \\ 0 & 0 & 0 & 0 & 0 & 0 & 1 & 0 \\ 0 & 0 & 0 & 0 & 0 & 1 & 0 & 0 \\ 0 & 0 & 0 & 0 & 1 & 0 & 0 & 0 \\ 0 & 0 & 0 & 1 & 0 & 0 & 0 & 0 \end{bmatrix}$$

ENCODERS AND METHODS FOR ENCODING DIGITAL DATA WITH LOW-DENSITY PARITY CHECK MATRIX

BACKGROUND

The present invention relates to low-density parity check (LDPC) codes, and more particularly, to encoders and methods for encoding digital data with LDPC matrices, where the encoders and methods can be applied to WiMAX, 802.11n, and other communication systems.

LDPC codes have become one of the hottest topics in current coding theory. First appearing around the middle of the twentieth century, LDPC codes have experienced an amazing comeback in the last few years since they are already equipped with very fast (probabilistic) encoding and decoding algorithms. Recovering the original codeword in the face of large amounts of noise was previously the most pressing issue, but new analytic and combinatorial tools make it possible to solve related design problems. As a result, LDPC codes are not only attractive from a theoretical point of view, but also suitable for practical applications.

Regarding implementation of encoding LDPC codes using a generator matrix, storing a very large matrix is required according to the related art, where LDPC codes typically require large blocks of a matrix to be effective and ready for use, so as to achieve better performance. Consequently, even though parity check matrices of LDPC codes may be sparse in some occasions, storing these matrices in a cost-effective manner without hindering the performance is still a problem for developers and researchers.

Please refer to FIG. 1. FIG. 1 illustrates a parity check matrix H of LDPC codes according to the related art, where a subscript $a_{i,j}$ of an element of the parity check matrix H may represent a shifting number f (which is typically a non-negative integer as known by those skilled in the related art), so this element can be referred to as $P_f$. Typically, each of a plurality of elements of the parity check matrix H is defined as a cyclic permutation matrix of a size L by L, with L representing a sub-block size, which is a sub-matrix size for the parity check matrix H. As shown in FIG. 2, FIG. 3, and FIG. 4, some examples of cyclic permutation matrices $P_f$ with L=8 according to the related art are illustrated for better comprehension. Generally speaking, the cyclic permutation matrix $P_f$ is produced by cyclically shifting columns of an identity matrix to the right by f number of places, where the cyclic permutation matrix $P_f$ is substantially the identity matrix if the shifting number f is zero.

Regarding a larger number of the sub-matrix size L, for example, L=81, if the height and the width of the parity check matrix H are respectively 12 and 24 (i.e. m=12 and c=24), the corresponding codeword block length n may reach 1944 bits (i.e. 243 bytes) and the total storage volume required for the parity check matrix H may reach 2916 bytes. It is noted that storing different parity check matrices corresponding to various conditions (e.g. various code rates or various transmission parameters) is typically required according to the related art. Therefore, storage requirements for these parity check matrices have become an important issue.

In addition, in a parity generator according to the related art, such as that shown in FIG. 5, a size of a multiplier accumulator (MAC) is directly related to the number of bits processed each time. As a result, the overall hardware architecture according to the related art is huge and cost ineffective.

SUMMARY

It is an objective of the claimed invention to provide encoders and methods for encoding digital data with low-density parity check (LDPC) matrices. It is another objective of the claimed invention to provide encoders and methods for encoding digital data with LDPC matrices, in order to minimize storage requirements without introducing greater complexity and without hindering LDPC encoding performance.

An exemplary embodiment of a method for encoding digital data with an LDPC matrix comprises: indirectly storing a non-regular portion of the LDPC matrix by storing a plurality of indices corresponding to a plurality of non-zero sub-matrices of the non-regular portion, and by storing a plurality of distance/location parameters respectively corresponding to numbers of zero sub-matrices between adjacent non-zero sub-matrices of the non-regular portion or respectively corresponding to distances between adjacent non-zero sub-matrices of the non-regular portion; generating at least one address according to at least one distance/location parameter; accessing information bits corresponding to the address; and recovering at least one element of the LDPC matrix according to at least one index and the information bits to encode according to the LDPC matrix.

An exemplary embodiment of an encoder for encoding digital data with an LDPC matrix comprises: a look-up table (LUT) for indirectly storing a non-regular portion of the LDPC matrix, where the LUT stores a plurality of indices corresponding to a plurality of non-zero sub-matrices of the non-regular portion, and further stores a plurality of distance/location parameters respectively corresponding to numbers of zero sub-matrices between adjacent non-zero sub-matrices of the non-regular portion or respectively corresponding to distances between adjacent non-zero sub-matrices of the non-regular portion; an address generator, coupled to the LUT, for generating at least one address according to at least one distance/location parameter; a code memory, coupled to the address generator, for storing code data, within which information bits corresponding to the address are capable of being accessed from the code memory according to the address; a mapping unit, coupled to the LUT, for mapping at least one index into at least one generator vector; a circular shift register, coupled to the mapping unit or the code memory, for performing a circular shift operation on the generator vector or the information bits; and a multiplier accumulator (MAC), coupled to the circular shift register, for recovering at least one element of the LDPC matrix at least according to a result of the circular shift operation to encode according to the LDPC matrix.

An exemplary embodiment of an encoder for encoding digital data with an LDPC matrix comprises: a LUT for indirectly storing a non-regular portion of the LDPC matrix, where the LUT stores a plurality of indices corresponding to a plurality of non-zero sub-matrices of the non-regular portion, and further stores a plurality of distance/location parameters respectively corresponding to numbers of zero sub-matrices between adjacent non-zero sub-matrices of the non-regular portion or respectively corresponding to distances between adjacent non-zero sub-matrices of the non-regular portion; an address generator, coupled to the LUT, for generating at least one address according to at least one distance/location parameter; a code memory, coupled to the address generator, for storing code data, within which information bits corresponding to the address are capable of being accessed from the code memory according to the address; an adder, coupled to the LUT, for performing an adding operation on at least one index; a mapping unit, coupled to the adder, for mapping a result of the adding operation into a corresponding row value; and a multiplier accumulator (MAC), coupled to the mapping unit and the code memory, for recovering at least one element of the LDPC matrix according to the row value and the information bits to encode according to the LDPC matrix.

An exemplary embodiment of an encoder for encoding digital data with an LDPC matrix comprises: a LUT for indirectly storing a non-regular portion of the LDPC matrix, where the LUT stores a plurality of indices corresponding to a plurality of non-zero sub-matrices of the non-regular portion, and further stores a plurality of distance/location parameters respectively corresponding to numbers of zero sub-matrices between adjacent non-zero sub-matrices of the non-regular portion or respectively corresponding to distances between adjacent non-zero sub-matrices of the non-regular portion; an address generator, coupled to the LUT, for generating at least one address according to at least one distance/location parameter; a code memory, coupled to the address generator, for storing code data, within which information bits corresponding to the address are capable of being accessed from the code memory according to the address; at least one circular shift register, coupled to the LUT and the code memory, for performing at least one circular shift operation on the information bits according to at least one index; and an array of exclusive OR (XOR) units, coupled to the circular shift register, for recovering at least one element of the LDPC matrix according to a result of the circular shift operation to encode according to the LDPC matrix.

An exemplary embodiment of an encoder for encoding digital data with an LDPC matrix comprises: a LUT for indirectly storing a non-regular portion of the LDPC matrix, where the LUT stores a plurality of indices corresponding to a plurality of non-zero sub-matrices of the non-regular portion, and further stores a plurality of distance/location parameters respectively corresponding to numbers of zero sub-matrices between adjacent non-zero sub-matrices of the non-regular portion or respectively corresponding to distances between adjacent non-zero sub-matrices of the non-regular portion; an address generator, coupled to the LUT, for generating at least one address according to at least one distance/location parameter; a code memory, coupled to the address generator, for storing code data, within which information bits corresponding to the address are capable of being accessed from the code memory according to the address; a modulo adder, coupled to the LUT, for performing a mod operation on at least one index; at least one multiplexer, coupled to the modulo adder and the code memory, for multiplexing a portion of the information bits according to a result of the mod operation; and an array of XOR units, coupled to the multiplexer, for recovering at least one element of the LDPC matrix according to the multiplexed portion to encode according to the LDPC matrix.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 illustrates a parity check matrix of low-density parity check (LDPC) codes according to the related art.

FIG. 2, FIG. 3, and FIG. 4 illustrate examples of cyclic-permutation matrices of a certain sub-block size according to the related art.

FIG. 8 illustrates an example of a subscript matrix corresponding to a quasi-cyclic LDPC (QC-LDPC) matrix utilized in the embodiment shown in FIG. 6.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 5:
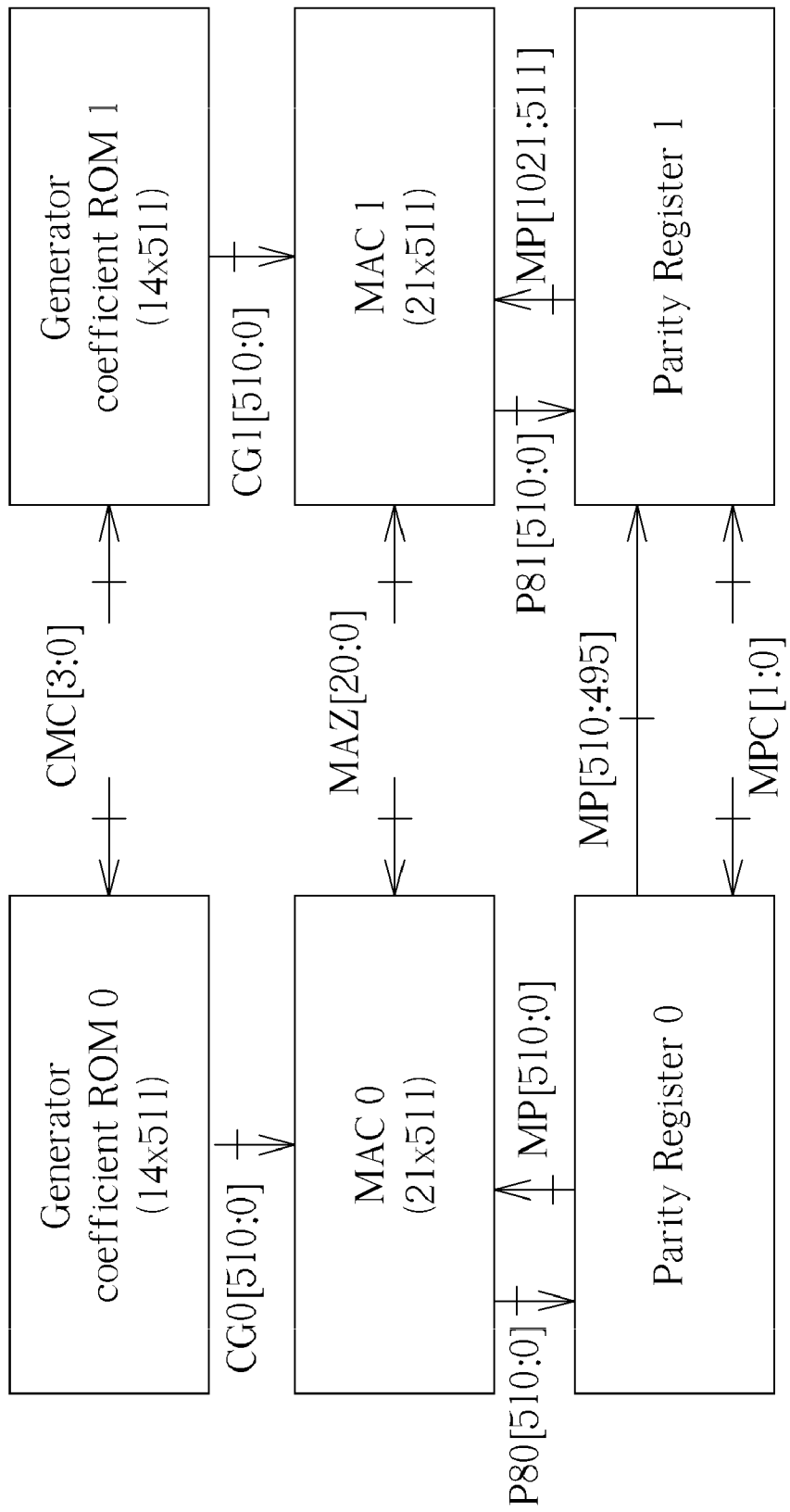
FIG. 5 is a diagram of a parity generator according to the related art.
Figure 6:
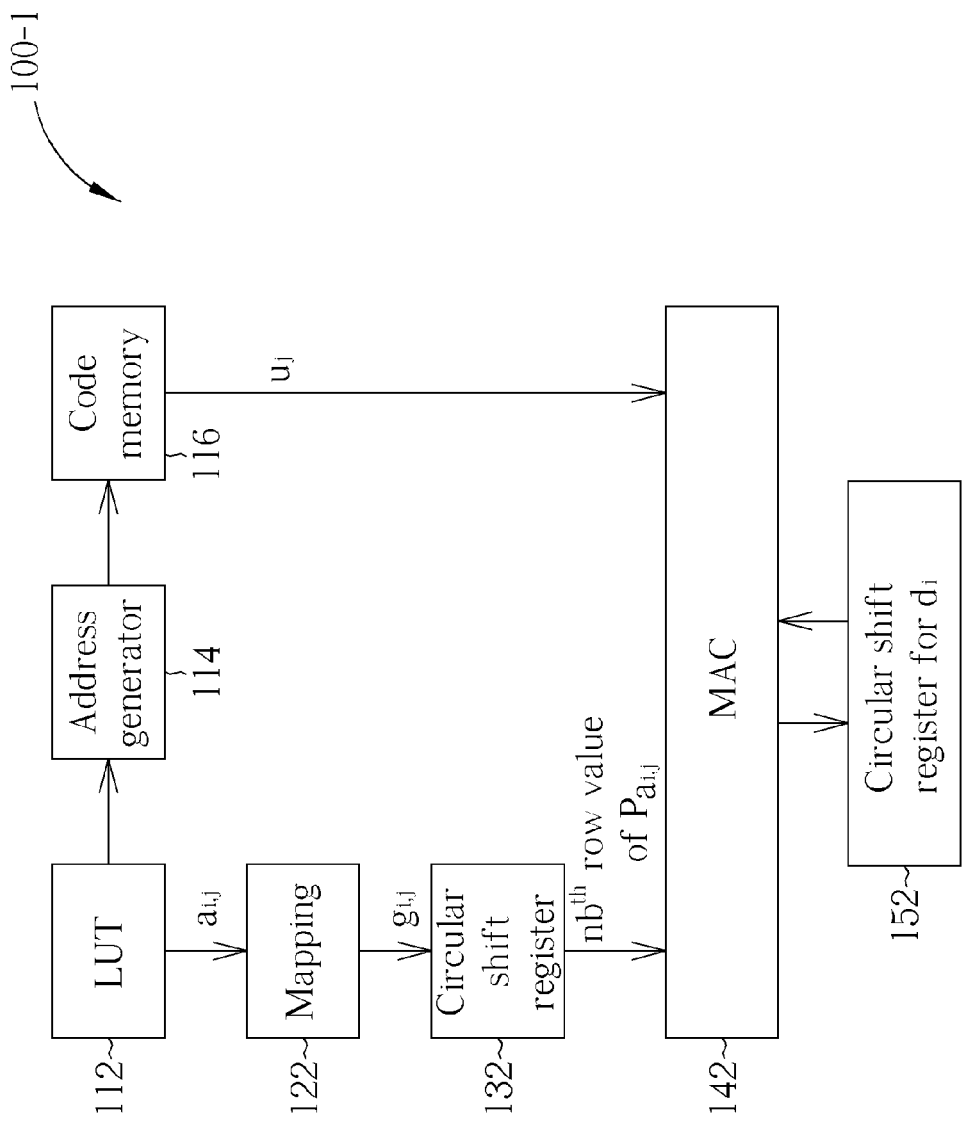
FIG. 6 is a diagram of an encoder for encoding digital data with an LDPC matrix according to one embodiment of the present invention.

Some notations such as H, $P_f$, $a_{i,j}$, m, c, and L mentioned above are utilized herein for better comprehension and for simplicity. Please refer to FIG. 6. FIG. 6 is a diagram of an encoder 100-1 for encoding digital data with a low-density parity check (LDPC) matrix, such as the parity check matrix H mentioned above, according to a first embodiment of the present invention. In this embodiment, the encoder 100-1 comprises a look-up table (LUT) 112, an address generator 114, a code memory 116, a mapping unit 122, a circular shift register 132, a multiplier accumulator (MAC) 142, and another circular shift register 152 (which is labeled as "Circular shift register for $d_i$" in this embodiment).

Figure 7:
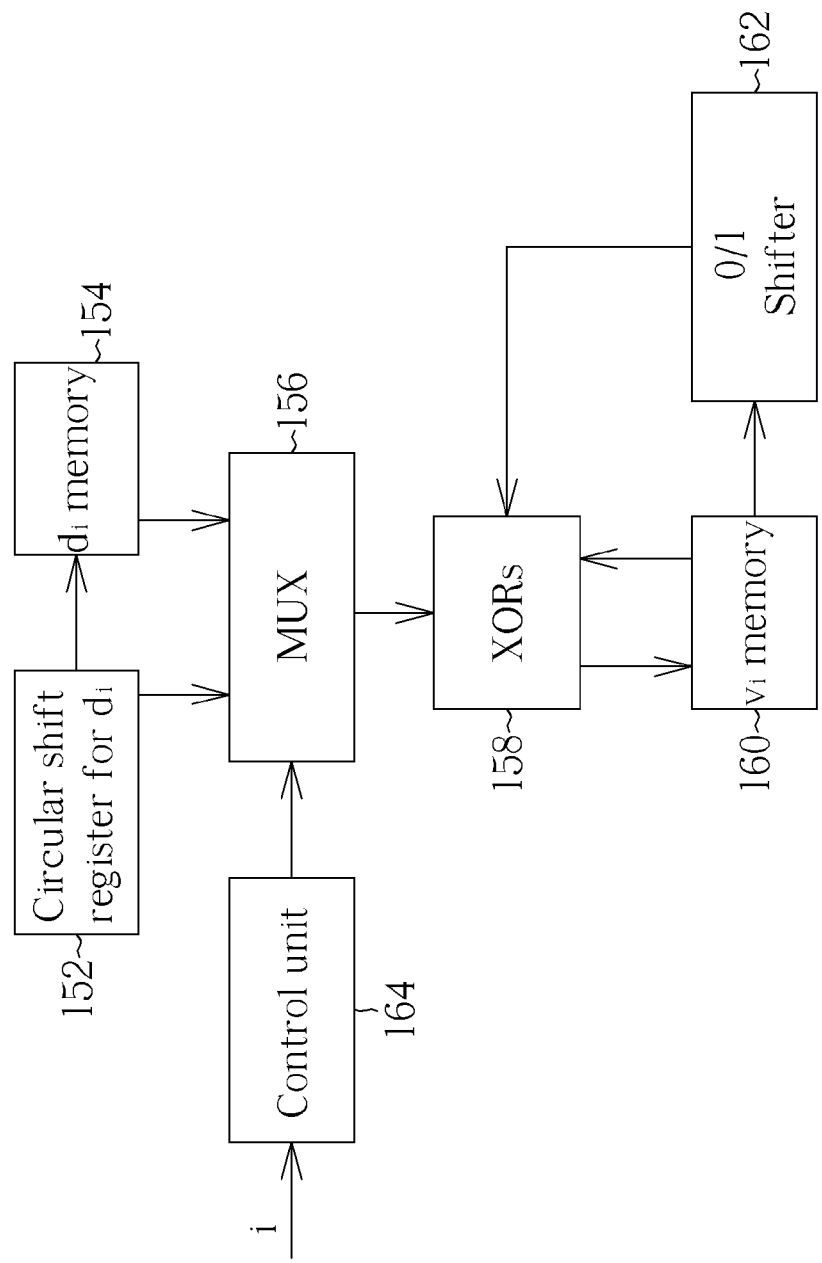
FIG. 7 illustrates some implementation details of the encoder shown in FIG. 6.

FIG. 7 further illustrates some implementation details of the encoder 100-1 shown in FIG. 6. The encoder 100-1 of this embodiment further comprises a memory 154 (labeled "$d_i$ memory" for storing "$d_i$"), a multiplexer 156, a plurality of exclusive OR (XOR) units 158 (labeled "XORs", i.e. XOR gates, in this embodiment), another memory 160 (labeled "$v_i$ memory" for storing "$v_i$"), a shifter 162 ("0/1 shifter"), and a control unit 164.

The LUT 112 of this embodiment is utilized for indirectly storing a non-regular portion of the LDPC matrix. More specifically in this embodiment, the LUT 112 stores a plurality of indices corresponding to a plurality of non-zero sub-matrices of the non-regular portion, and further stores a plurality of distance/location parameters respectively corresponding to numbers of zero sub-matrices between adjacent non-zero sub-matrices of the non-regular portion or respectively corresponding to distances between adjacent non-zero sub-matrices of the non-regular portion. In this embodiment, the plurality of indices represent a plurality of shifting numbers such as the shifting number f mentioned above. More particularly in this embodiment, the plurality of indices is substantially the plurality of shifting numbers respectively.

According to the first embodiment, the LDPC matrix such as the parity check matrix H shown in FIG. 1 comprises an array of elements, where at least one element of the LDPC matrix represents a cyclic permutation matrix produced by cyclically shifting columns of an identity matrix to the right according to one of the shifting numbers. More particularly in this embodiment, the cyclic permutation matrix (e.g. one of those shown in FIG. 2, FIG. 3, and FIG. 4 if L=8) is produced by cyclically shifting the columns of the identity matrix to the right by a number of places, where the number is one of the shifting numbers mentioned above. Please note that, according to the mathematical definition in this embodiment, if a shifting number is zero so a corresponding cyclic permutation matrix is produced by cyclically shifting the columns of the identity matrix to the right by "zero" places, the corresponding cyclic permutation matrix is substantially the identity matrix.

Figure 8:
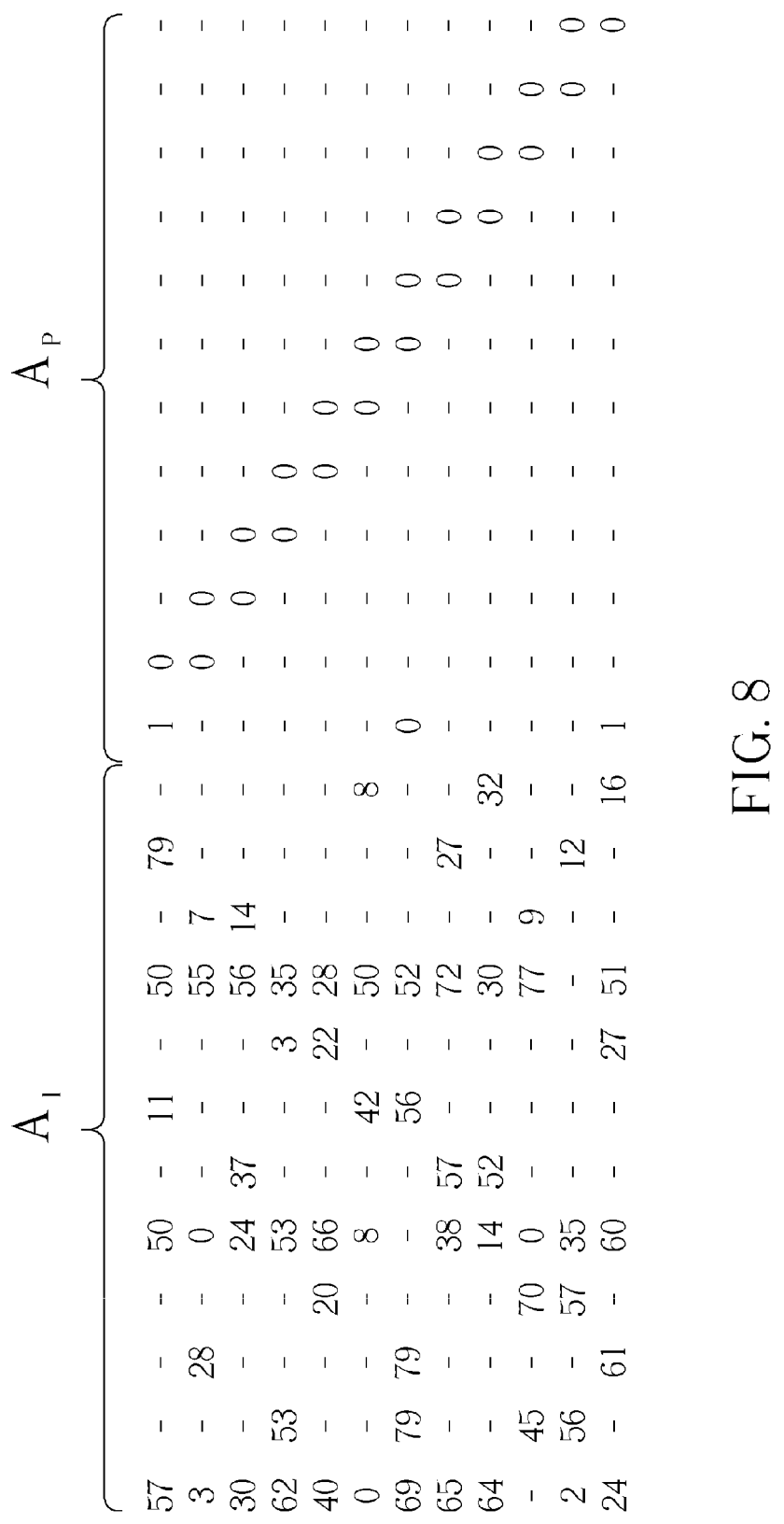

In the following, an encoding scheme such as that provided in the embodiment shown in FIG. 6 and FIG. 7 is first taken as an example for disclosing an aspect of a method for encoding digital data with an LDPC matrix in detail. According to the first embodiment, the parity check matrix H is a quasi-cyclic LDPC (QC-LDPC) matrix such as that corresponding to a subscript matrix $A=[a_{i,j}]$ ($i=1, 2, \ldots, m; j=1, 2, \ldots, c$) shown in FIG. 8 with m=12 and c=24, where some elements of the subscript matrix A with the label "−" as shown in FIG. 8 represent zero sub-matrices. Here, the parity check matrix H can be divided into two portions, i.e. $[H_I|H_P]$, with $H_P$ complying with some rules, where the portion $H_P$ can be considered as a regular portion, and the portion $H_I$ (which is an information portion) can be considered as the non-regular portion mentioned above. As the rules mentioned above or corresponding parameters related to the rules can be stored in the LUT 112, the encoder 100-1 may utilize the rules or the corresponding parameters thereof to recover the portion $H_P$. Therefore, the storage requirement corresponding to the portion $H_P$ can be minimized.

In addition, the subscript matrix A can be divided into two portions correspondingly, i.e. $[A_I|A_P]$ such as those shown in FIG. 8. Rather than storing any sub-matrix $P_i$ of the parity check matrix H (e.g. storing sub-matrices $P_{57}, P_{50}, P_{11}, \ldots$, etc. as typically suggested according to the related art), the LUT 112 stores a plurality of elements $a_{i,j}$ of the subscript matrix A (e.g. the values 57, 50, 11, ..., etc.) as the plurality of indices, which means the LUT 112 of this embodiment stores the shifting numbers mentioned above (e.g. the shifting number f) as the indices. As a result, the goal of minimizing storage requirements without introducing greater complexity and without hindering LDPC encoding performance can be achieved since the encoder 100-1 is capable of retrieving at least one index to recover at least one element of the LDPC matrix (e.g. the sub-matrices $P_{57}, P_{50}, P_{11}, \ldots$, etc. of the QC-LDPC matrix) according to the index. Regarding a large number of the sub-matrix size L, for example, L=81, the storage requirements are therefore greatly minimized.

According to this embodiment, if the distance/location parameters correspond to row directions, meaning the distances or distance/location parameters are measured along the rows, the plurality of distance/location parameters can substantially be a plurality of distance parameters (e.g. 0, 4, 2, ..., etc.) respectively corresponding to distances in a run-value form such as (0, 57), (4, 50), (2, 11), ..., etc. In such a case, the "0" in (0, 57) represents that the first sub-matrix $P_{57}$ in the first row of the QC-LDPC matrix (or the first value 57 in the first row of the subscript matrix A) is at the initial location (i.e. the upper-left corner in this embodiment), while the "4" in (4, 50) represents that the distance between the corresponding sub-matrices $P_{57}$ and $P_{50}$ in the first row of the QC-LDPC matrix (i.e. the distance between the values 57 and 50 in the first row of the subscript matrix A) is equal to 4. Likewise, the "2" in (2, 11) represents that the distance between the corresponding sub-matrices $P_{50}$ and $P_{11}$ in the first row of the QC-LDPC matrix (i.e. the distance between the values 50 and 11 in the first row of the subscript matrix A) is equal to 2, and so on.

Some notations shown in FIG. 6 are defined as follows. The notation $g_{i,j}$ represents a generator vector, which are the right circular-shifted $a_{i,j}$ bits of $[1, 0, \ldots, 0]$. As a result, $g_{i,j}$ is substantially the first column of $P_f$ with $f=a_{i,j}$. In addition, The notations u and v respectively represent an information vector and a parity vector within a code C, i.e. C=[u|v], where $H*C^T=0=[H_I|H_P]*[u|v]^T$. Here, the vectors u and v can be further written as follows:

$$u=[u_1|u_2|\ldots|u_{c-m}]; \text{ and}$$

$$v=[v_1|v_2|\ldots|v_m];$$

where both $u_i$ and $v_i$ are L-bit vectors. Additionally, the notation $u_i[0:L-1]$ is utilized for representing bit 0 to bit (L−1) of the vector $u_i$, and the notation $u^{(q)}$ is utilized for representing the right circular-shifted q bits of the vector u.

An encoding procedure of the method according to the first embodiment can be described as follows.
Step 911: $d_i^T = \Sigma_{j=1 \text{ to } (c-m)} P_f * U_j^T$;
  with $f=a_{i,j}$ and i varying from 1 to m.
Step 912: $v_1 = \Sigma_{i=1 \text{ to } m} d_i$.
Step 913: Derive $v_2, v_3, \ldots, v_m$ by utilizing some relationships between different $v_i$.
More specifically in Step 913, each of $V_2, V_3, \ldots, V_m$ can be derived by utilizing previously derived $d_i$ and $v_i$. For example, according to specifications of 802.11n/D104 with Z=81 and R=½, Step 913 can be written as follows.

$$v_2 = d_1 + v_1^{(1)};$$

$v_t = d_{t-1} + v_{t-1}$, with t varying from 3 to 12 except 8; and $$v_8 = d_7 + v_7 + v_1.$$

In the following, a pseudo code according to specifications of 802.11n is further taken as an example for explaining implementation of the hardware architecture such as that shown in FIG. 6 and FIG. 7, where $v_i$ is calculated at the same time as $d_i$ is calculated.

```
v₁ = 0;
for (i = 1; i <= m; i++)
{
    dᵢᵀ = Σⱼ₌₁ ₜₒ (c-m) Pf * ujᵀ ; (where f = aᵢ,ⱼ)
    v₁ = v₁ + dᵢ;
}
v₂ = d₁ + v₁⁽¹⁾;
for (t = 3; i <= 7; t++)
    vₜ = dₜ₋₁ + vₜ₋₁;
v₈ = d₇ + v₇ + v₁;
for (t = 9; i <= 12; t++)
    vₜ = dₜ₋₁ + vₜ₋₁;
```

Within the encoder 100-1, the portion for calculating $d_i$ is illustrated as shown in FIG. 6. The address generator 114 corresponds to the "run" part of the run-value form (i.e. the distance parameters), and is utilized for generating at least one address according to at least one distance/location parameter from the LUT 112. According to this embodiment, b bits are calculated at once in a calculation operation. In addition, the code memory 116 is utilized for storing code data, within which information bits corresponding to the address can be accessed from the code memory 116 according to the address. As shown in FIG. 6, the code memory 116 outputs $u_j$ to the MAC 142.

Please note that Step 911 can be written as follows:

$$d_i[k] = \Sigma_{j=1 \text{ to } (c-m)} (g_{i,j}^{(k)} * U_j);$$

where k varies from nb to $((n+1)*b-1)$. Regarding another path on the left as shown in FIG. 6, the mapping unit 122 is utilized for mapping at least one index $a_{i,j}$ into at least one generator vector $g_{i,j}$, while the circular shift register 132 is utilized for performing a circular shift operation on the generator vector $g_{i,j}$ to generate the $nb^{th}$ row value of $P_f$ with $f=a_{i,j}$. In addition, the MAC 142 of this embodiment comprises at least (L*b) AND gates and (L*b) XOR gates, where the MAC 142 and corresponding components such as the circular shift register 152 and those shown in FIG. 7 can be utilized for recovering at least one element of the LDPC matrix to encode according to the LDPC matrix. The circular shift register 152 inputs $d_i$ from the MAC 142, and further outputs left circular-shifted b bits of $d_i$ to the MAC 142, in order to update $d_i$.

As shown in FIG. 7, the memory 154 is coupled to the circular shift register 152, in order to save $d_i$ as long as $d_i$ is calculated. A left input and a right input of the multiplexer 156 respectively correspond to the calculations for $v_1$ and the other $v_i$, where the control unit 164 controls the input selection of the multiplexer 156 according to i. The XOR units 158, the memory 160, and the shifter 162 cooperate to calculate as shown in the pseudo code mentioned above, where the shifter 162 is utilized for shifting $v_i$ when needed.

According to a variation of this embodiment, the distance parameters may correspond to column directions, which means the distances or distance parameters are measured along the column directions.

According to another variation of this embodiment, the plurality of distance/location parameters can substantially be a plurality of distance parameters (e.g. 4, 2, 2, . . . , etc.) respectively corresponding to distances in a value-run form such as (57, 4), (50, 2), (11, 2), . . . , etc. As before, the "4" in (57, 4) represents that the distance between the corresponding sub-matrices $P_{57}$ and $P_{50}$ in the first row of the QC-LDPC matrix (i.e. the distance between the values 57 and 50 in the first row of the subscript matrix A) is equal to 4, and the "2" in (50, 2) represents that the distance between the corresponding sub-matrices $P_{50}$ and $P_{11}$ in the first row of the QC-LDPC matrix (i.e. the distance between the values 50 and 11 in the first row of the subscript matrix A) is equal to 2, and so on.

According to another variation of this embodiment, the plurality of distance/location parameters can substantially be a plurality of distance parameters respectively corresponding to numbers of zero sub-matrices between adjacent non-zero sub-matrices of $H_I$. If the distance parameters correspond to row directions, the LUT 112 may store distance parameters (e.g. 3, 1, 1, . . . , etc.) respectively corresponding to distances in a value-run form such as (57, 3), (50, 1), (11, 1), . . . , etc. In this variation, the "3" in (57, 3) represents that the number of zero sub-matrices between the adjacent non-zero sub-matrices $P_{57}$ and $P_{50}$ is equal to 3, the "1" in (50, 1) represents that the number of zero sub-matrices between the adjacent non-zero sub-matrices $P_{50}$ and $P_{11}$ is equal to 1, and so on.

According to another embodiment of the present invention, which is a variation of the first embodiment, the plurality of indices respectively corresponds to a plurality of non-zero sub-matrices of $H_I$ as mentioned above. The plurality of distance/location parameters can, however, substantially be a plurality of location parameters respectively corresponding to locations of the non-zero sub-matrices of $H_I$. If the location parameters correspond to both row locations and column locations of the non-zero sub-matrices of $H_I$, the LUT 112 may store location parameters (e.g. (1, 1), (1, 5), (1, 7), . . . , etc.) respectively corresponding to the locations of the non-zero sub-matrices $P_{57}$, $P_{50}$, $P_{11}$, . . . , etc. of $H_I$ in a value-location form such as (57, 1, 1), (50, 1, 5), (11, 1, 7), . . . , etc. For example, the (1, 1) carried in (57, 1, 1) represents that the location of the first sub-matrix $P_{57}$ in the first row of the QC-LDPC matrix (or the first value 57 in the first row of the subscript matrix A) is at (1, 1) (i.e. the upper-left corner in this embodiment), and the (1, 5) carried in (50, 1, 5) represents that the location of the sub-matrix $P_{50}$ in the first row of the QC-LDPC matrix (or the value 50 in the first row of the subscript matrix A) is at (1, 5), etc.

According to a variation of this embodiment, the LUT 112 may store location parameters (e.g. (1, 1), (1, 5), (1, 7), . . . , etc.) respectively corresponding to the locations of the non-zero sub-matrices $P_{57}$, $P_{50}$, $P_{11}$, . . . , etc. of $H_I$ in a location-value form such as (1, 1, 57), (1, 5, 50), (1, 7, 11), . . . , etc., where the meanings thereof can be derived according to the descriptions disclosed above, and are therefore not explained in detail here.

Figure 9:
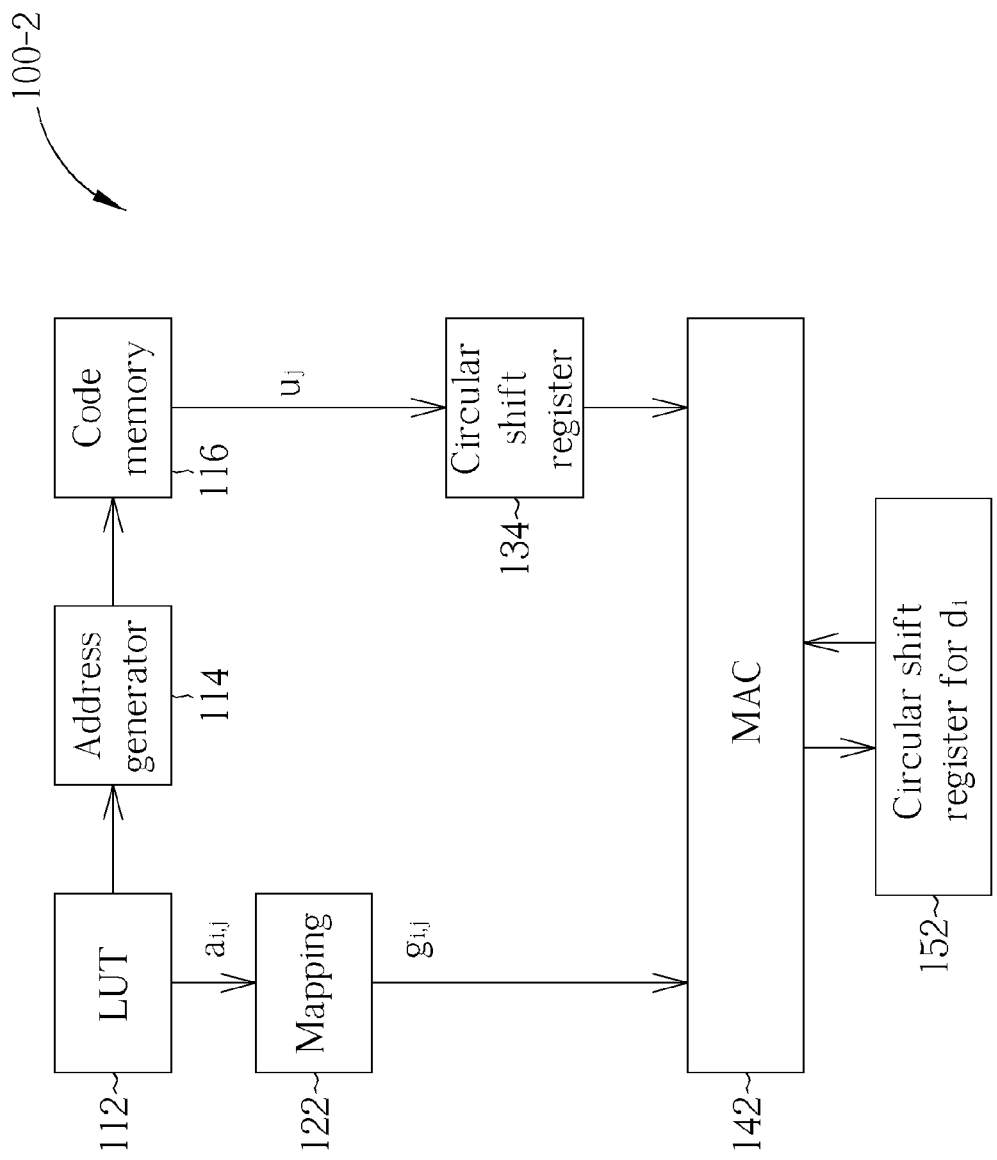
FIG. 9 is a diagram of an encoder for encoding digital data with an LDPC matrix according to a variation of the embodiment shown in FIG. 6.

FIG. 9 is a diagram of an encoder 100-2 for encoding digital data with an LDPC matrix according to a variation of the embodiment shown in FIG. 6. According to this variation, the circular shift register 132 mentioned above is replaced with another circular shift register 134 while varied coupling relationships between related components are illustrated as shown in FIG. 9. The varied coupling relationships can be derived since Step 911 can be written as follows:

$$d_i^T[k] = \Sigma_{j=1 \text{ to } (c-m)} (g_{i,j} * U_j^{(-k)});$$

where k varies from nb to $((n+1)*b-1)$. Similar descriptions for this variation are not repeated in detail.

Figure 10:
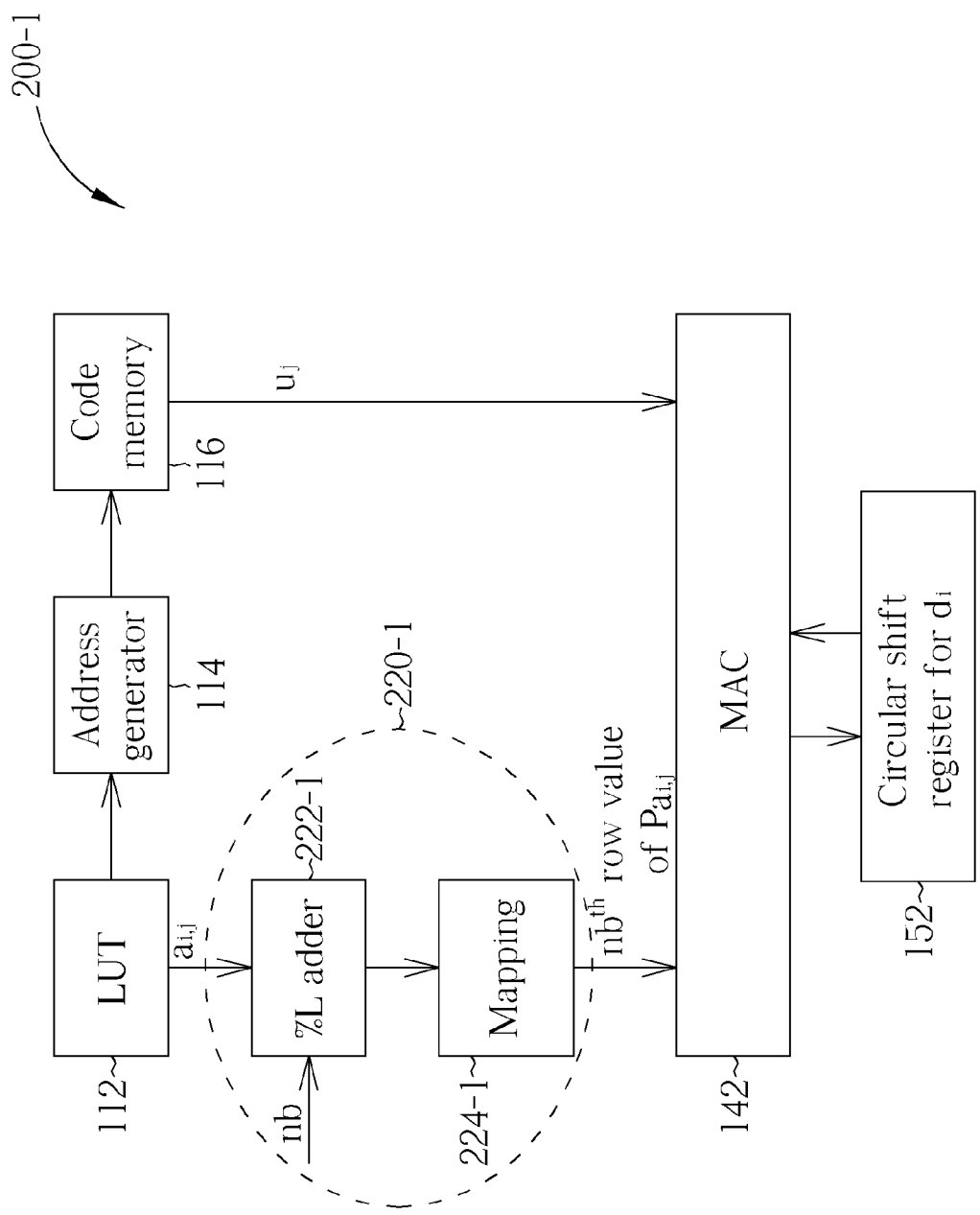
FIG. 10 is a diagram of an encoder for encoding digital data with an LDPC matrix according to another embodiment of the present invention.

FIG. 10 is a diagram of an encoder 200-1 for encoding digital data with an LDPC matrix according to a second embodiment of the present invention. This embodiment is a variation of the first embodiment. The mapping unit 122 and the circular shift register 132 mentioned above are replaced with another module 220-1 comprising a modulo adder 222-1 (which is labeled as "% L adder") and a mapping unit 224-1, in order to achieve a smaller chip area in contrast to the first embodiment. The modulo adder 222-1 is utilized for performing a mod operation according to the index $a_{i,j}$ from the LUT 112 and another input nb. Similar descriptions for this embodiment are not repeated in detail.

Figure 11:
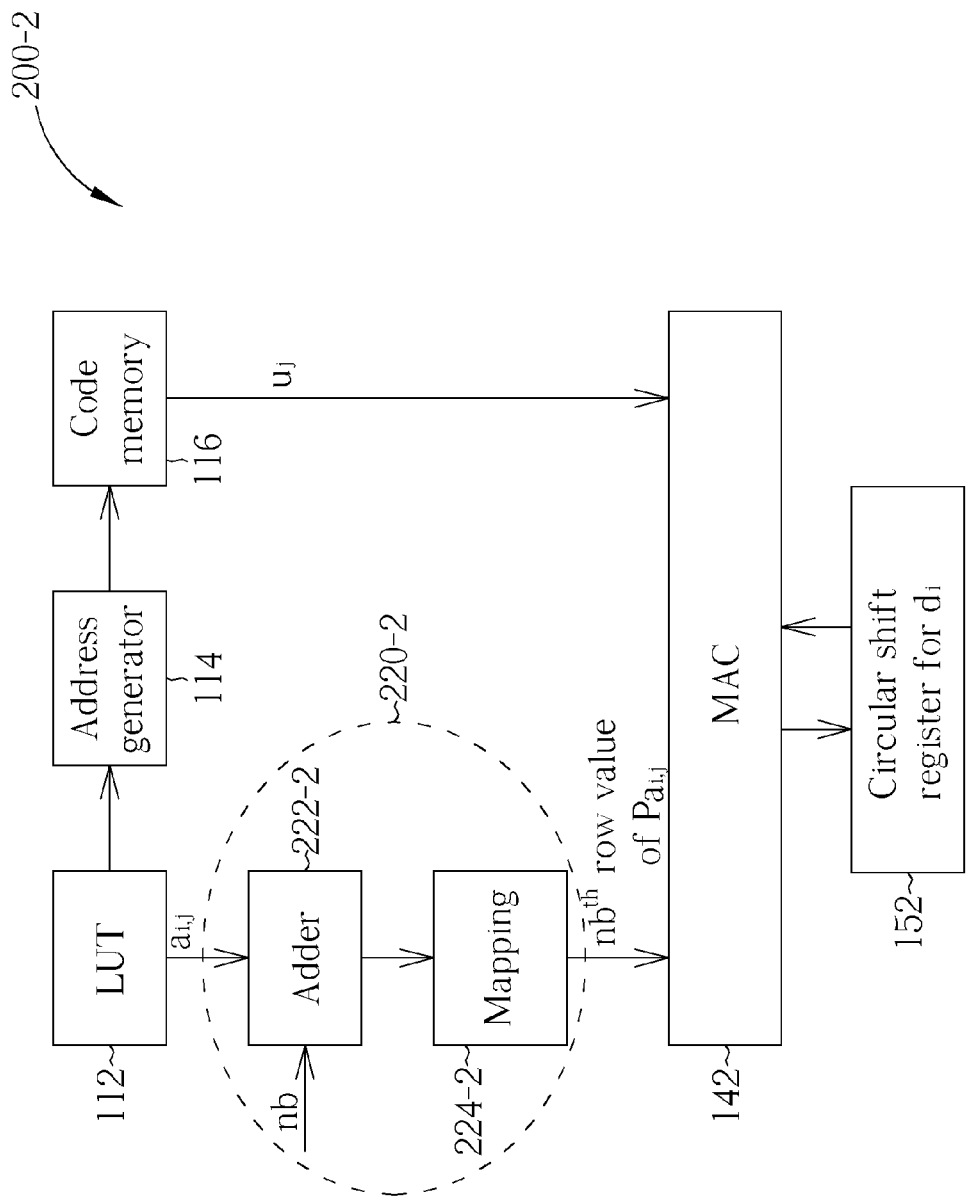
FIG. 11 is a diagram of an encoder for encoding digital data with an LDPC matrix according to a variation of the embodiment shown in FIG. 10.

FIG. 11 is a diagram of an encoder 200-2 for encoding digital data with an LDPC matrix according to a variation of the embodiment shown in FIG. 10. In this variation, the module 220-1 is replaced with another module 220-2 comprising a normal adder 222-2 and a mapping unit 224-2, where the adder 222-2 is utilized for performing an adding operation on the index $a_{i,j}$ from the LUT 112 according to another input nb, and the mapping unit 224-2 may cover a wider range, from 0 to (2L−b−1). Similar descriptions for this variation are not repeated in detail.

Figure 12:
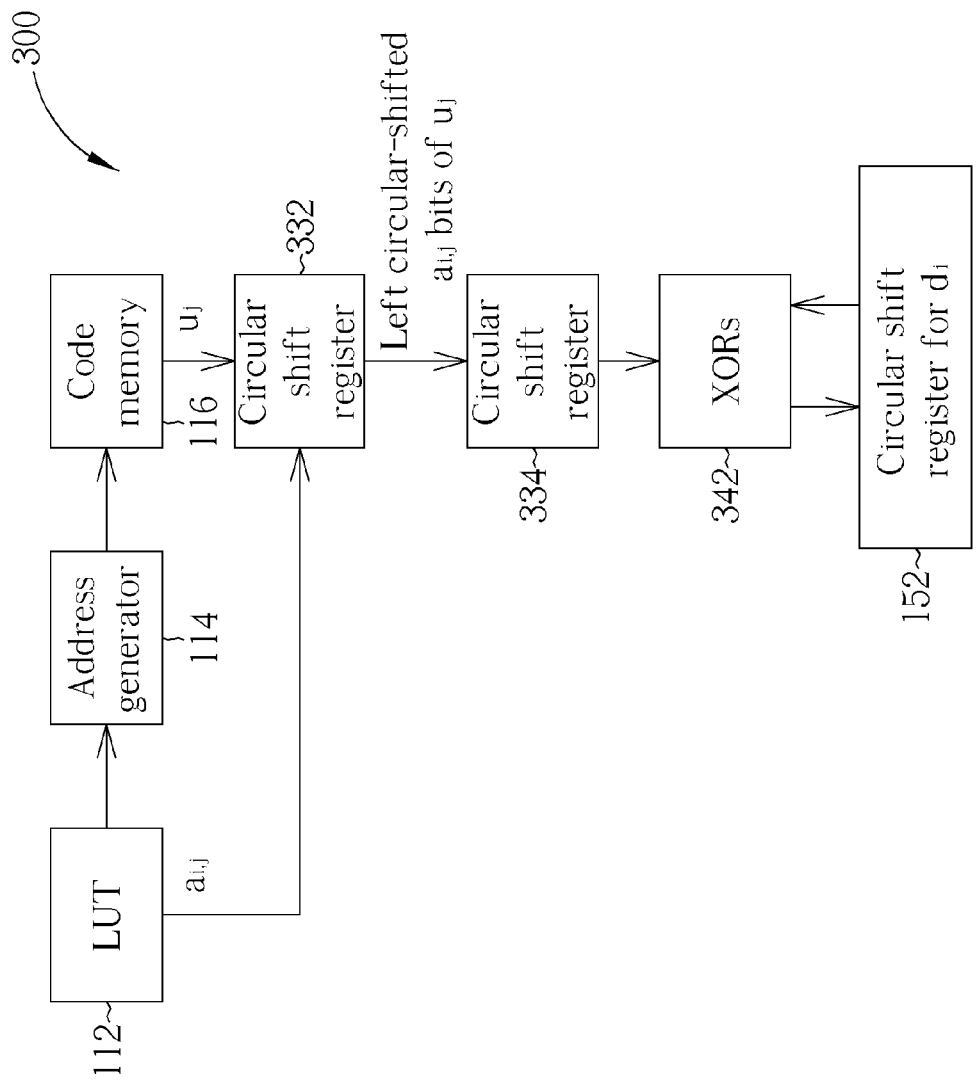
FIG. 12 is a diagram of an encoder for encoding digital data with an LDPC matrix according to another embodiment of the present invention.

FIG. 12 is a diagram of an encoder 300 for encoding digital data with an LDPC matrix according to a third embodiment of the present invention. This embodiment is also a variation of the first embodiment. As shown in FIG. 12, at least one circular shift register is utilized for performing at least one circular shift operation on the information bits from the code memory 116 according to at least one index $a_{i,j}$ from the LUT 112. In this embodiment, the circular shift register 332 outputs left circular-shifted $a_{i,j}$ bits of $u_j$ to the circular shift register 334, and the circular shift register 334 shifts b bits at once in a calculation operation. Accordingly, an array of XOR units 342 (which is labeled as "XORs") replaces the MAC 142 mentioned above. The varied coupling relationships can be derived since Step 911 can be written as:

$$d_i[k] = \Sigma_{j=1 \text{ to } (c-m)} u_j[(a_{i,j}+k) \% L];$$

where k varies from nb to ((n+1)*b−1). Similar descriptions for this embodiment are not repeated in detail.

Figure 13:
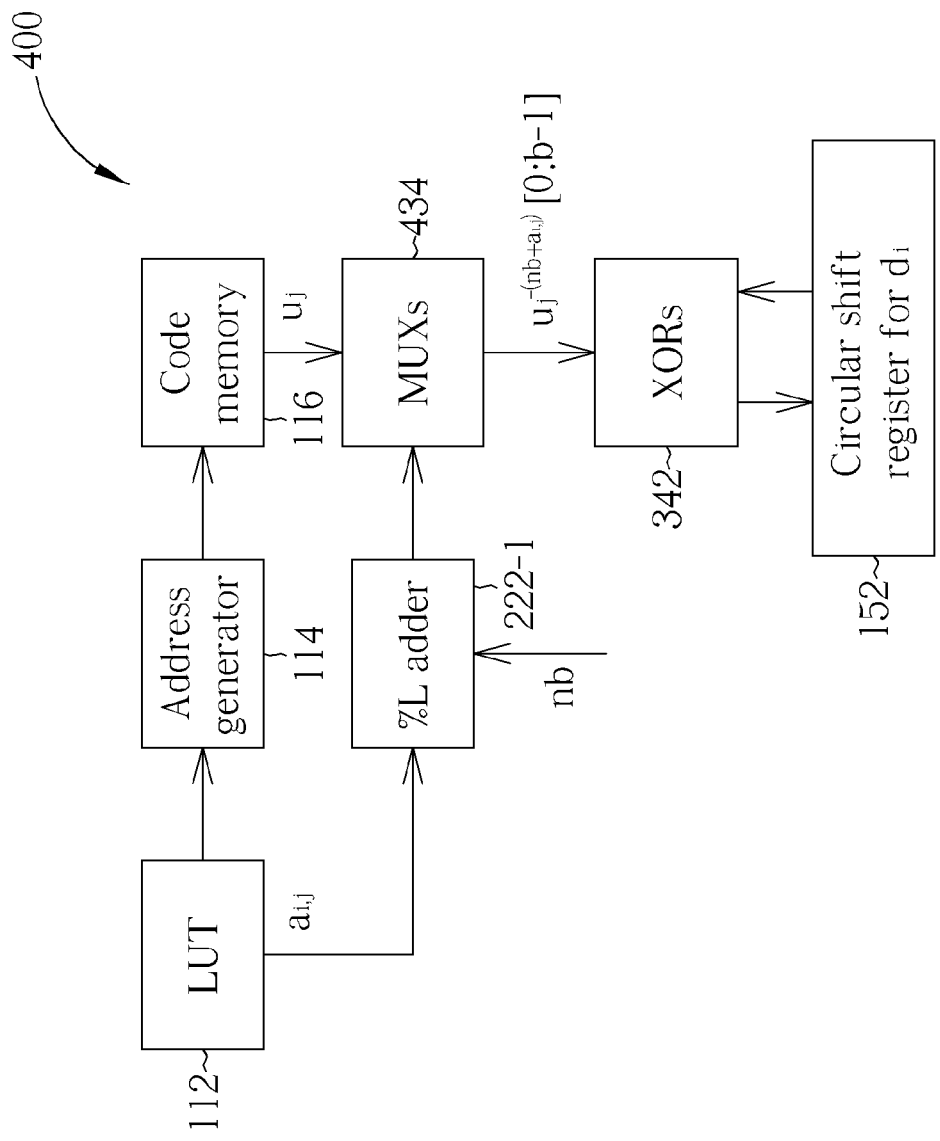
FIG. 13 is a diagram of an encoder for encoding digital data with an LDPC matrix according to another embodiment of the present invention.

FIG. 13 is a diagram of an encoder 400 for encoding digital data with an LDPC matrix according to a fourth embodiment of the present invention. This embodiment is not only a variation of the first embodiment, but also a variation of the third embodiment. The modulo adder 222-1 mentioned above is now utilized for controlling the input selection of a plurality of multiplexers 434 (which is labeled as "MUXs"), so the plurality of multiplexers 434 may multiplex a portion of the information bits from the code memory 116 according to a result of the mod operation performed by the modulo adder 222-1. As shown in FIG. 13, the plurality of multiplexers 434 outputs $u_j^{-(nb+f)}[0:b-1]$ to the array of XOR units 342 with $f=a_{i,j}$. Similar descriptions for this embodiment are not repeated in detail.

In contrast to the related art, the present invention's encoders and methods are capable of minimizing storage requirements without introducing greater complexity and without hindering LDPC encoding performance.

It is another advantage of the present invention that a reduced number of clock cycles can be achieved by utilizing the present invention's encoders and methods since the number of clock cycles according to the calculations disclosed above can be written as:

$$xL/b+(m-1);$$

where x represents the number of non-zero sub-matrices of the non-regular portion within the LDPC matrix.

Those skilled in the art will readily observe that numerous modifications and alterations of the device and method may be made while retaining the teachings of the invention.

What is claimed is:

1. A method for encoding digital data with a low-density parity check (LDPC) matrix, the method comprising:
   indirectly storing a non-regular portion of the LDPC matrix, further comprising:
      storing a plurality of indices corresponding to a plurality of non-zero sub-matrices of the non-regular portion; and
      storing a plurality of distance/location parameters respectively corresponding to numbers of zero sub-matrices between adjacent non-zero sub-matrices of the non-regular portion or respectively corresponding to distances between adjacent non-zero sub-matrices of the non-regular portion;
   generating at least one address according to at least one distance/location parameter;
   accessing information bits corresponding to the address; and
   recovering at least one element of the LDPC matrix according to at least one index and the information bits to encode the digital data according to the LDPC matrix.

2. The method of claim 1, wherein the plurality of indices represents a plurality of shifting numbers, the LDPC matrix comprises an array of elements, and at least one element of the LDPC matrix represents a cyclic permutation matrix that is produced by cyclically shifting columns of an identity matrix to the right according to one of the shifting numbers.

3. The method of claim 2, wherein the plurality of indices is substantially the plurality of shifting numbers.

4. The method of claim 1, further comprising:
   providing a look-up table (LUT) for storing the plurality of indices and/or the plurality of distance/location parameters.

5. The method of claim 1, wherein the LDPC matrix is a quasi-cyclic LDPC (QC-LDPC) matrix.

6. The method of claim 1, wherein the step of recovering at least one element of the LDPC matrix according to at least one index and the information bits further comprises:
   mapping the index into a generator vector;
   performing a circular shift operation on the generator vector or the information bits; and
   providing a multiplier accumulator (MAC) for recovering the element of the LDPC matrix at least according to a result of the circular shift operation to encode the digital data according to the LDPC matrix.

7. The method of claim 6, wherein when the circular shift operation is performed on the generator vector, the MAC operates according to the information bits and the result of the circular shift operation; and when the circular shift operation is performed on the information bits, the MAC operates according to the generator vector and the result of the circular shift operation.

8. The method of claim 1, wherein the step of recovering at least one element of the LDPC matrix according to at least one index and the information bits further comprises:
   performing an adding operation on the index;
   mapping a result of the adding operation into a corresponding row value; and
   providing a multiplier accumulator (MAC) for recovering the element of the LDPC matrix according to the row value and the information bits to encode the digital data according to the LDPC matrix.

9. The method of claim 1, wherein the step of recovering at least one element of the LDPC matrix according to at least one index and the information bits further comprises:
   performing at least one circular shift operation on the information bits according to the index; and
   providing an array of exclusive OR (XOR) units for recovering the element of the LDPC matrix according to a result of the circular shift operation to encode the digital data according to the LDPC matrix.

10. The method of claim 1, wherein the step of recovering at least one element of the LDPC matrix according to at least one index and the information bits further comprises:
   performing a mod operation on the index;
   multiplexing a portion of the information bits according to a result of the mod operation to generate a multiplexed portion of the information bits; and
   providing an array of exclusive OR (XOR) units for recovering the element of the LDPC matrix according to the multiplexed portion of the information bits to encode the digital data according to the LDPC matrix.

11. An encoder for encoding digital data with a low-density parity check (LDPC) matrix, the encoder comprising:
   a look-up table (LUT) for indirectly storing a non-regular portion of the LDPC matrix, wherein the LUT stores a plurality of indices corresponding to a plurality of non-zero sub-matrices of the non-regular portion, and further stores a plurality of distance/location parameters respectively corresponding to numbers of zero sub-matrices between adjacent non-zero sub-matrices of the non-regular portion or respectively corresponding to distances between adjacent non-zero sub-matrices of the non-regular portion;

an address generator, coupled to the LUT, for generating at least one address according to at least one distance/location parameter;

a code memory, coupled to the address generator, for storing code data, within which information bits corresponding to the address are capable of being accessed from the code memory according to the address;

a mapping unit, coupled to the LUT, for mapping at least one index into at least one generator vector;

a circular shift register, coupled to the mapping unit or to the code memory, for performing a circular shift operation on the generator vector or the information bits; and a multiplier accumulator (MAC), coupled to the circular shift register, for recovering at least one element of the LDPC matrix according to a result of the circular shift operation to encode the digital data according to the LDPC matrix.

12. The encoder of claim 11, wherein the plurality of indices represents a plurality of shifting numbers, the LDPC matrix comprises an array of elements, and at least one element of the LDPC matrix represents a cyclic permutation matrix that is produced by cyclically shifting columns of an identity matrix to the right according to one of the shifting numbers.

13. The encoder of claim 12, wherein the plurality of indices is substantially the plurality of shifting numbers.

14. The encoder of claim 11, wherein when the circular shift operation is performed on the generator vector, the circular shift register is coupled to the mapping unit, and the MAC operates according to the information bits and the result of the circular shift operation; and when the circular shift operation is performed on the information bits, the circular shift register is coupled to the code memory, and the MAC operates according to the generator vector and the result of the circular shift operation.

15. An encoder for encoding digital data with a low-density parity check (LDPC) matrix, the encoder comprising:

a look-up table (LUT) for indirectly storing a non-regular portion of the LDPC matrix, wherein the LUT stores a plurality of indices corresponding to a plurality of non-zero sub-matrices of the non-regular portion, and further stores a plurality of distance/location parameters respectively corresponding to numbers of zero sub-matrices between adjacent non-zero sub-matrices of the non-regular portion or respectively corresponding to distances between adjacent non-zero sub-matrices of the non-regular portion;

an address generator, coupled to the LUT, for generating at least one address according to at least one distance/location parameter;

a code memory, coupled to the address generator, for storing code data, within which information bits corresponding to the address are capable of being accessed from the code memory according to the address;

an adder, coupled to the LUT, for performing an adding operation on at least one index;

a mapping unit, coupled to the adder, for mapping a result of the adding operation into a corresponding row value; and a multiplier accumulator (MAC), coupled to the mapping unit and the code memory, for recovering at least one element of the LDPC matrix according to the row value and the information bits to encode the digital data according to the LDPC matrix.

16. The encoder of claim 15, wherein the plurality of indices represents a plurality of shifting numbers, the LDPC matrix comprises an array of elements, and at least one element of the LDPC matrix represents a cyclic permutation matrix that is produced by cyclically shifting columns of an identity matrix to the right according to one of the shifting numbers.

17. The encoder of claim 16, wherein the plurality of indices is substantially the plurality of shifting numbers.

18. The encoder of claim 15, wherein the adder is a modulo adder.

19. An encoder for encoding digital data with a low-density parity check (LDPC) matrix, the encoder comprising:

a look-up table (LUT) for indirectly storing a non-regular portion of the LDPC matrix, wherein the LUT stores a plurality of indices corresponding to a plurality of non-zero sub-matrices of the non-regular portion, and further stores a plurality of distance/location parameters respectively corresponding to numbers of zero sub-matrices between adjacent non-zero sub-matrices of the non-regular portion or respectively corresponding to distances between adjacent non-zero sub-matrices of the non-regular portion;

an address generator, coupled to the LUT, for generating at least one address according to at least one distance/location parameter;

a code memory, coupled to the address generator, for storing code data, within which information bits corresponding to the address are capable of being accessed from the code memory according to the address;

at least one circular shift register, coupled to the LUT and the code memory, for performing at least one circular shift operation on the information bits according to at least one index; and an array of exclusive OR (XOR) units, coupled to the circular shift register, for recovering at least one element of the LDPC matrix according to a result of the circular shift operation to encode the digital data according to the LDPC matrix.

20. The encoder of claim 19, wherein the plurality of indices represents a plurality of shifting numbers, the LDPC matrix comprises an array of elements, and at least one element of the LDPC matrix represents a cyclic permutation matrix that is produced by cyclically shifting columns of an identity matrix to the right according to one of the shifting numbers.

21. The encoder of claim 20, wherein the plurality of indices is substantially the plurality of shifting numbers.

22. An encoder for encoding digital data with a low-density parity check (LDPC) matrix, the encoder comprising:

a look-up table (LUT) for indirectly storing a non-regular portion of the LDPC matrix, wherein the LUT stores a plurality of indices corresponding to a plurality of non-zero sub-matrices of the non-regular portion, and further stores a plurality of distance/location parameters respectively corresponding to numbers of zero sub-matrices between adjacent non-zero sub-matrices of the non-regular portion or respectively corresponding to distances between adjacent non-zero sub-matrices of the non-regular portion;

an address generator, coupled to the LUT, for generating at least one address according to at least one distance/location parameter;

a code memory, coupled to the address generator, for storing code data, within which information bits corresponding to the address are capable of being accessed from the code memory according to the address;

a modulo adder, coupled to the LUT, for performing a mod operation on at least one index;

at least one multiplexer, coupled to the modulo adder and the code memory, for multiplexing a portion of the information bits according to a result of the mod operation; and an array of exclusive OR (XOR) units, coupled to the multiplexer, for recovering at least one element of the LDPC matrix according to the multiplexed portion to encode the digital data according to the LDPC matrix.

23. The encoder of claim 22, wherein the plurality of indices represents a plurality of shifting numbers, the LDPC matrix comprises an array of elements, and at least one element of the LDPC matrix represents a cyclic permutation matrix that is produced by cyclically shifting columns of an identity matrix to the right according to one of the shifting numbers.

24. The encoder of claim 23, wherein the plurality of indices is substantially the plurality of shifting numbers.

* * * * *